US005801103A

United States Patent [19]

Rasmussen et al.

[11] Patent Number: 5,801,103
[45] Date of Patent: Sep. 1, 1998

[54] ETCHING PROCESS WHICH PROTECTS METAL

[75] Inventors: Robert T. Rasmussen, Boise; Surjit S. Chadha, Meridian; David A. Cathey, Boise, all of Id.

[73] Assignee: Micron Technology, Inc., Boise, Id.

[21] Appl. No.: 566,513

[22] Filed: Dec. 4, 1995

Related U.S. Application Data

[63] Continuation of Ser. No. 480,846, Jun. 7, 1995, Pat. No. 5,695,661.
[51] Int. Cl.⁶ .................................................. H01L 21/302
[52] U.S. Cl. .................. 438/753; 438/745; 148/DIG. 51
[58] Field of Search .................................. 438/689, 745, 438/753; 156/628.1; 148/DIG. 51

[56] References Cited

U.S. PATENT DOCUMENTS

| 4,040,897 | 8/1977 | Blish et al. |
| 5,591,354 | 1/1997 | Patel et al. ............................ 216/83 |

*Primary Examiner*—John Niebling
*Assistant Examiner*—Long Pham
*Attorney, Agent, or Firm*—Hale and Dorr LLP

[57] ABSTRACT

The present invention is directed to a novel etching process for a semiconductor material which inhibits corrosion of metal comprised of pretreating the material, preferably with a surfactant, and then exposing the material to a mixture comprising a buffered oxide etch.

24 Claims, No Drawings

ETCHING PROCESS WHICH PROTECTS METAL

This is continuation application of U.S. Ser. No. 08/480, 846, filed on Jun. 7, 1995, now U.S. Pat. No. 5,695,661.

This invention was made with Government support under Contract No. DABT63-93C-0025 awarded by Advanced Research Project Agency (ARPA). The Government has certain rights in this invention.

FIELD OF THE INVENTION

The invention relates to a process for etching glass or $SiO_2$, with metal present wherein the metal is not etched or corroded during the etching of the glass or $SiO_2$.

BACKGROUND OF THE INVENTION

It is customary in the art to etch glass (amorphous $SiO_2$ films) with an aqueous solution of an acid, for example hydrofluoric acid, buffered with, e.g., ammonium fluoride. In the semiconductor industry, it is commonly necessary to etch semiconductor materials like glass formed on a metal substrate, such as aluminum, or to etch glass having metal conducting lines on a silicon wafer or die. The acid and by-products during the etching process attack and corrode the metal.

It has been reported that the addition of a diol alcohol to a buffered acid etching solution inhibits its attack upon the metal. Moreover it has been reported that a suitable amount of diol alcohol, e.g., ethylene glycol, to obtain this result is somewhere on the order of fifty percent of the etching solution. For example, it has been stated in U.S. Pat. No. 4,040,897 that a typical formulation using a diol alcohol to inhibit attack upon the metal is comprised as follows: five parts of a buffered oxide etch ("BOE") comprising thirty-four parts by weight of a forty percent aqueous ammonium fluoride solution, five parts of a forty-nine percent aqueous hydrofluoric acid solution, five parts of ethylene glycol and three parts water. In the same patent, it is reported that the diol alcohol containing etchant solution is nearly saturated and that it has a high viscosity which renders it difficult to rinse off and/or to etch small openings in a photoresist. It is reported this formulation tends to corrode the metal intermittently.

U.S. Pat. No. 4,040,897 titled "Etchants for Glass Films on Metal Substrates" discloses a method of etching a glass layer on a metal substrate comprising contacting the glass layer with a dilute aqueous etch solution for a sufficient time to etch through the glass layer. The etch solution disclosed in U.S. Pat. No. 4,040,897 is comprised of a buffered hydrofluoric acid, sodium chloride, and a fluorocarbon surfactant. However, it has been found that using the process disclosed in U.S. Pat. No. 4,040,897 does not completely protect the metal from attack and thus corrosion. Indeed, it has been found that upon exposure to the etchant solution and before the surfactant can coat the metal, the metal is attacked by the acid etchant and by-products and corroded to some extent. In addition, it has been found that the above-discussed processes do not protect the metal substrate from galvanic action which is frequently encountered in wet etching processes with semiconductor materials. More significantly, it has been discovered that the use of salts, like sodium chloride, can under certain circumstances, e.g., during the removal of native oxides on the micro-cathode emitter tips of field emission displays, cause unwanted doping of the silicon substrate by the transference of an ion into the semiconductor. Therefore, there is a need for an etching system wherein metals are protected and the substrate is not unnecessarily doped with, e.g., a sodium ion.

SUMMARY OF THE INVENTION

The invention is directed to an etching process for semiconductor materials which protects metals from corrosion comprising: (1) pretreating the material to be etched (to protect the metal), and (2) exposing said material to a mixture of a buffered oxide etch and a salt. The salt is added in a sufficient amount so that the mixture maintains a natural saturation equilibrium during the etching process and/or any electrolysis effects are neutralized. Preferably, the material is pretreated with a surfactant. Alternatively, the process of the present invention may include pretreating only the metal with a surfactant. In addition, the exposing step may include a surfactant.

The invention is also directed to an etchant for semiconductor materials comprising: (1) from about 0.03 to about 0.06 percent by weight surfactant, (2) from about 15 to about 30 percent by weight buffered oxide etch, and (3) a salt in sufficient quantity to neutralize electrolysis effects.

The invention is further directed to a semiconductor material etched by the process of the present invention. The process comprises: (1) pretreating the material with a surfactant, preferably a fluorocarbon surfactant, and (2) exposing said pretreated material to an etchant bath comprising from about 2 to about 4 percent by weight salt, from about 16 to about 28 percent by weight buffered oxide etch, and (3) agitating the bath. The etchant bath is preferably comprised of sodium chloride in an amount such that the bath maintains a natural saturation equilibrium. Optionally, if desired, the etchant bath may include a surfactant.

The invention is also directed to an etching process for semiconductor materials comprising (1) pretreating the material with a surfactant, and (2) exposing the pretreated material to a composition, e.g., an etchant bath, comprised of a buffered oxide etch ("BOE"), a polyhydric alcohol like polyethylene glycol, and a surfactant.

In addition, the invention is directed to an etching process for semiconductor materials which protects metals and eliminates the unwanted doping of the semiconductor comprising: (1) pretreating the material, and (2) exposing the material to a composition, e.g., an etchant bath, comprised of a buffered oxide etch ("BOE") and a polyhydric alcohol, e.g., a dihydric alcohol like glycol and preferably, polyethylene glycol.

DETAILED DESCRIPTION OF THE INVENTION

The aqueous etching solution of the present invention is directed to the etching of glass or $SiO_2$ wherein metal is present. More specifically, the etching process of the present invention is directed to a process for etching glass wherein metal is present without attacking and/or thus corroding the metal during the etching process and unwanted doping of the glass is eliminated or reduced. The etching solution of the present invention includes, according to one embodiment, conventional buffered oxide etches ("BOE"), a salt, and a surfactant and according to a further embodiment, conventional buffered oxide etches ("BOE"), a polyhydric alcohol, and a surfactant. In addition to the water of the BOE solution, more water may be added to the overall etching solution.

Conventional buffered oxide etch solutions may be employed in the practice of the present invention. Conventional BOEs may be comprised of varying ratios of ammonium fluoride and hydrofluoric acid in an aqueous solution. The preferred BOE is "BOE 410" manufactured by Olin and Hunt which is comprised of ammonium fluoride, hydrofluoric acid and water in the following ratio: four parts of a 28.5 to 40 percent ammonium fluoride solution, one part of a 7.0 to 8.4 percent hydrofluoric acid solution, and five parts water. In addition, a BOE 710 may be utilized which is comprised of: seven parts of a 33 to 35 percent ammonium fluoride solution, one part of a 6 to 9 percent hydrofluoric acid solution, and two parts water.

A preferable salt useful in the practice of the present invention is sodium chloride. However, other alkali halide salts may be used in the practice of the present invention. For example, potassium chloride, potassium bromide, sodium bromide, cesium chloride, cesium bromide, rubidium chloride and rubidium bromide may be utilized.

A preferable polyhydric alcohol useful in the practice of the present invention is a dihydric alcohol, e.g., glycol. Preferably, polyethylene glycol is used in the practice of the present invention. However, other polyhydric alcohols may be utilized in the practice of the invention, e.g., 1,3 propanediol and 1,4 butanediol, etc. Preferably, the bath contains from about 60 percent by weight to about 75 percent by weight polyhydric alcohol.

In order to help protect the metal from corrosion, according to one embodiment of the invention, it has been found that it is necessary to always keep the etching solution at a natural saturation equilibrium. It is believed this neutralizes the electrolysis effects of the process. To achieve this, it has been found necessary to always keep the salt in excess of its solubility limit in the solution. This can be obtained by adding the salt last during the preparation of the etchant bath. Preferably, the etching solution or bath includes an excess amount of solid salt settled in the bottom of the etching container.

In order to eliminate or reduce, when desired, unwanted doping of the semiconductor material being etched, according to one embodiment of the invention, it has been found necessary to remove the salt from the etchant bath. In addition, according to another embodiment, it has been found that the etchant bath should include a polyhydric alcohol, like a glycol, preferably polyethylene glycol. Consequently, the etchant bath may include from about 60 percent by weight to about 75 percent by weight polyhydric alcohol.

In the practice of the present invention, preferably a surfactant is employed which is not detrimental to the etching process but, is however capable of protecting the metal substrate from attack by the acid and by-products in the etch. Surfactants useful in the practice of the present invention include the fluorocarbon surfactants: "Fluorad FC-120," "Fluorad FC-129," and "Fluorad FC-135." Fluorad FC-120, FC-129, and FC-135 are manufactured by the Specialty Chemicals Division of 3M. FC-120 is comprised of: (1) 37.5 percent by weight 2-butoxyethanol, (2) 36.0–39.0 percent by weight water, (3) 21.0–24.0 percent ammonium perfluoralkyl sulfonate (C10), (4) 1.0–3.0 percent by weight ammonium perfluoralkyl sulfonate (C8), and (5) 0.1–1.0 percent by weight diisopropyl ether. FC-129 comprises: (1) 40.0–44.0 percent by weight potassium fluoralkyl carboxylate (C8), (2) 32.0 percent by weight water, (3) 14.0 percent by weight 2-butoxyethanol, (4) 4.0 percent by weight ethanol, (5) 1.0–5.0 percent by weight potassium fluoralkyl carboxylate (C6), (6) 1.0–5.0 percent potassium fluoralkyl carboxylate (C4), (7) 1.0–3.0 percent by weight potassium fluoralkyl carboxylate (C7), and (8) 0.1–1.0 percent by weight potassium fluoralkyl carboxylate (C5). FC-135 comprises: (1) 40.0–44.0 percent by weight fluoralkyl quaternary ammonium iodide (C8), (2) 33.0 percent by weight isopropyl alcohol, (3) 17.0 percent by weight water, (4) 1.0–5.0 percent by weight fluoralkyl quaternary ammonium iodide (C6), (5) 1.0–4.0 percent by weight fluoralkyl quaternary ammonium iodide (C7), (6) 1.0–4.0 percent by weight fluoralkyl quaternary ammonium iodide (C4), (7) 1.0–2.0 percent by weight fluoralkyl quaternary ammonium iodide, and (8) 0.1 percent by weight methyliodide.

In the practice of the present invention, the following steps may be followed: (1) the semiconductor material is pretreated, preferably by exposure to about 500 to 1000 ppm surfactant for approximately one minute (however, other amounts of surfactant for varying amounts of time may be utilized depending upon the particular surfactant used and the amount and type of metal to be protected), and (2) the semiconductor material is exposed to the etching solution bath for the necessary time to achieve the result desired, e.g., removal of oxide.

The etching solution or mixture, according to one embodiment, is made by adding the following constituents into a container in the order listed: (1) from about 70 weight percent to about 80 weight percent water, (2) from about 15 weight percent to about 30 weight percent buffered oxide etch, and (3) from about 2 weight percent to about 4 weight percent salt. In addition, the etchant bath may include from about 0.03 to about 0.06 weight percent surfactant. Preferably, the etchant, etching solution or mixture is comprised of about 0.05 percent by weight surfactant, about 4.0 percent by weight sodium chloride, about 76 percent by weight water, and about 19.0 percent by weight BOE 410. It should be recognized that while it is preferred to use the same surfactant for the pretreatment step and the exposing step it is not required. In fact, if pretreated appropriately, there is no need for a surfactant in the exposure step of the process in certain circumstances, e.g., when the etch time is very short.

The etching solution or mixture, according to one embodiment, is made by adding the following constituents into a container in the order listed: (1) from about 15 weight percent to about 20 weight percent water, (2) from about 5 weight percent to about 10 weight percent buffered oxide etch, and (3) from about 60 weight percent to about 75 weight percent polyhydric alcohol. In addition, the etchant bath may include from about 0.03 to about 0.06 weight percent surfactant. Preferably, the etchant, etching solution or mixture is comprised of about 0.05 percent by weight surfactant, about 74 percent by weight polyethylene glycol, about 19 percent by weight water, and about 6.0 percent by weight BOE 410. It should be recognized that while it is preferred to use the same surfactant for the pretreatment step and the exposing step it is not required. In fact, if pretreated appropriately, there is no need for a surfactant in the exposure step of the process in certain circumstances, e.g., when the etch time is very short.

In the normal etching process, that is, comprising an etching bath, the semiconductor material is dipped into the bath for the necessary time to achieve the desired result under agitation. Upon completion of the desired purpose, for example, the removal of oxide, the semiconductor material is preferably rinsed rigorously for approximately one minute with, for example, deionized water followed by further rinsing and drying in a semitool.

In the preparation of the etching solution and/or bath, according to one embodiment, as stated above, it has been found necessary to keep the salt, for example, sodium chloride, in excess of its solubility limit in the solution. The excess salt keeps the solution at a natural equilibrium which is believed necessary to neutralize the electrolysis effects of the etching process so that the metal is not attacked or corroded. It is important to note that the mixing order of the bath is specific, as set forth above. For instance, if the salt is totally dissolved in the water prior to the addition of the remaining constituents, then the metal will delaminate and/or dissolve from the substrate instantaneously from areas where galvanic action occurs. On the other hand, if the salt is left out completely, corrosion of the metal may occur in areas where the opposite galvanic reaction occurs.

While the invention is directed to various modifications and alternate forms, specific embodiments have been shown by way of example and have been described in detail herein. However, it should be understood that the invention is not intended to be limited to particular embodiments disclosed. Rather, the invention is to cover all modifications, equivalents and alternatives falling within the spirit and the scope of the invention as defined by the appended claims.

We claim:

1. An etching process for a semiconductor material upon which metal is disposed the method comprising the steps of:

pretreating the material to be etched by exposing the material to a surfactant capable of protecting the metal from acid and etch by-products; and exposing said material to an etching solution.

2. The etching process of claim 1 wherein the pretreating step exposes the material to a fluorocarbon surfactant.

3. The etching process of claim 1 wherein the exposing step is performed with an etching solution comprising a buffered oxide etch and a salt.

4. The etching process of claim 1 wherein the exposing step is performed with an etching solution comprising a buffered oxide etch and a polyhydric alcohol.

5. An etching process for a semiconductor material upon which metal is disposed the method comprising the steps of:

pretreating the material by exposing the material to a surfactant capable of protecting the metal from acid and etch by-products; and exposing said pretreated material to an etching solution wherein said solution comprises a buffered oxide etch, a surfactant, and a polyhydric alcohol.

6. The etching process of claim 5 wherein the pretreating and exposing steps are performed with a fluorocarbon surfactant.

7. The etching process of claim 5 wherein the etching solution of the exposing step is performed with polyethylene glycol.

8. The etching process of claim 5 wherein the etching solution of the exposing step is performed with a buffered oxide etch comprising ammonium fluoride, hydrofluoric acid, and water.

9. The etching process of claim 5 wherein the etching solution of the exposing step comprises from about 0.03 percent by weight to about 0.06 percent by weight fluorocarbon surfactant, from about 60 percent by weight to about 75 percent by weight polyhydric alcohol, and from about 5 percent by weight to about 10 percent by weight BOE 410.

10. In a process for etching a semiconductor material comprising glass and a metal, an improvement comprising:

pretreating the material, before etching, by exposing the material to a surfactant capable of protecting the metal from acid and etch by-products.

11. The process of claim 10 wherein the pretreating step is performed with a fluorocarbon surfactant.

12. An etching process for a semiconductor material partly comprised of metal comprising:

pretreating the metal by exposing the material to a surfactant capable of protecting the metal from acid and etch by-products; and exposing the material to an etching solution comprising a surfactant and a buffered oxide etch.

13. The etching process of claim 12 wherein the pretreating and exposing steps are performed with a fluorocarbon surfactant.

14. The etching process of claim 12 wherein the exposing step is performed with an etching solution further comprising a salt.

15. The etching process of claim 12 wherein the exposing step is performed with an etching solution further comprising a polyhydric alcohol.

16. The process of claim 3 in which no surfactant is added to the etching solution.

17. The process of claim 2 in which the pretreating step exposes the material to the surfactant for approximately one minute of time and in which the concentration of the surfactant is about 500 to 1000 ppm.

18. The process of claim 3 in which the etching solution is kept at natural saturation equilibrium.

19. The process of claim 18 in which the salt is sodium chloride.

20. The process of claim 19 in which natural saturation equilibrium is attained by keeping the sodium chloride in excess of its solubility limit in the etching solution.

21. The process of claim 3 further comprising a step of forming the etching solution by mixing, in order, water, the buffered oxide etch, and the salt.

22. The process of claim 21 in which the buffered oxide etch is from about 70 weight percent to about 80 weight percent, the buffered oxide etch is from about 15 weight percent to about 30 weight percent, and the salt is from about 2 weight percent to about 4 weight percent.

23. The process of claim 5 further comprising a step of forming the etching solution by mixing, in order, water, the buffered oxide etch, and the polyhydric alcohol.

24. The process of claim 23 in which the water is from about 15 weight percent to about 20 weight percent, the buffered oxide etch is from about 5 weight percent to about 10 weight percent, and the polyhydric alcohol is from about 60 weight percent to about 75 weight percent.

* * * * *